(12) United States Patent
Rassel et al.

(10) Patent No.: US 9,041,910 B2
(45) Date of Patent: May 26, 2015

(54) MULTI FACET MIRROR OF A MICROLITHOGRAPHIC PROJECTION EXPOSURE APPARATUS WITH A TILTING ACTUATOR

(71) Applicant: Carl Zeiss SMT GmbH, Oberkochen (DE)

(72) Inventors: Thorsten Rassel, Huettlingen (DE); Markus Hauf, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 311 days.

(21) Appl. No.: 13/747,142

(22) Filed: Jan. 22, 2013

(65) Prior Publication Data

US 2013/0128252 A1 May 23, 2013

Related U.S. Application Data

(63) Continuation of application No. PCT/EP2010/005195, filed on Aug. 25, 2010.

(51) Int. Cl.
  *G03B 27/54* (2006.01)
  *G03F 7/20* (2006.01)
  *G02B 5/09* (2006.01)

(52) U.S. Cl.
  CPC ........ *G03F 7/70141* (2013.01); *G03F 7/70075* (2013.01); *G03F 7/70825* (2013.01); *G02B 5/09* (2013.01)

(58) Field of Classification Search
  CPC ... G02B 5/09; G03F 7/70075; G03F 7/70141; G03F 7/70825

USPC ........ 355/67, 53; 359/872, 850, 225.1, 221.2, 359/200.8, 199.1, 198.1, 197.1; 310/311; 318/49

See application file for complete search history.

(56) References Cited

U.S. PATENT DOCUMENTS

| | | |
|---|---|---|
| 2005/0030653 A1 | 2/2005 | Holderer et al. |
| 2006/0220492 A1* | 10/2006 | Greywall ...................... 310/309 |
| 2008/0309901 A1 | 12/2008 | Rene et al. |
| 2009/0225297 A1 | 9/2009 | Bleidistel et al. |
| 2012/0044474 A1 | 2/2012 | Hauf et al. |

FOREIGN PATENT DOCUMENTS

| | | |
|---|---|---|
| DE | 197 15 226 | 10/1998 |
| WO | WO 2005/026843 | 3/2005 |
| WO | WO 2010/037476 | 4/2010 |
| WO | WO 2010/049076 | 5/2010 |

OTHER PUBLICATIONS

International Search Report for corresponding PCT Appl No. PCT/EP2010/005195, dated Apr. 28, 2011.

* cited by examiner

*Primary Examiner* — Peter B Kim
*Assistant Examiner* — Michelle Iacoletti
(74) *Attorney, Agent, or Firm* — Fish & Richardson P.C.

(57) ABSTRACT

A multi facet mirror of a microlithographic projection exposure apparatus includes a plurality of mirror facet units. Each unit includes a mirror member with a body, a reflective coating provided at one end of the body and an actuating surface provided at an opposite end. The unit further includes a rest member on which the actuating surface rests while the mirror member is not moving, and an actuator that tilts the mirror member about a tilting axis. The actuator has a contact surface and a lifting member which moves the actuating surface along a lifting direction. In a first operating state of the lifting member the actuating surface rests on the rest member and in a second operating state on the contact surface. A displacement member displaces the contact surface along a lateral direction only while the lifting member is in the second operating state.

20 Claims, 16 Drawing Sheets

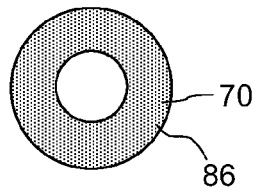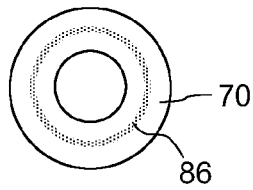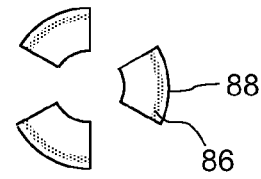
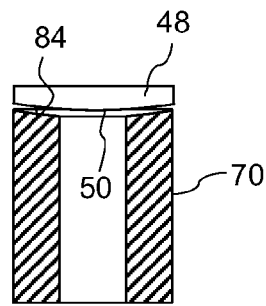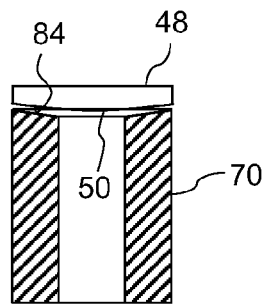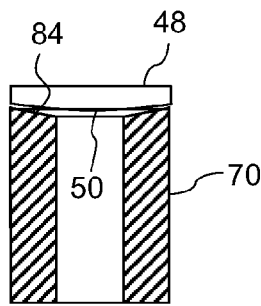
Fig. 11　　　　Fig. 12　　　　Fig. 13
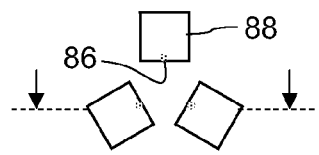
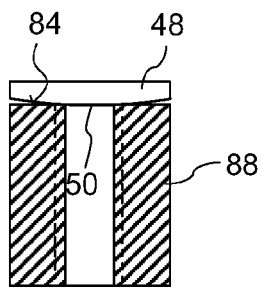
Fig. 14

MULTI FACET MIRROR OF A MICROLITHOGRAPHIC PROJECTION EXPOSURE APPARATUS WITH A TILTING ACTUATOR

CROSS-REFERENCE TO RELATED APPLICATIONS

The present application is a continuation of, and claims benefit under 35 USC 120 to, international application PCT/EP2010/005195, filed Aug. 25, 2010. The contents of this application is hereby incorporated by reference in its entirety.

FIELD

The disclosure generally relates to a multi facet mirror of a microlithographic projection exposure apparatus. Such mirrors are often used, for example, in the illumination system of next generation EUV apparatus.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to produce patterns in thin film stacks that have been formed on a substrate, for example a silicon wafer. At each layer of the fabrication, the wafer is first coated with a photoresist which is a material that is sensitive to electromagnet radiation. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus generally includes an illumination system, a mask alignment stage for aligning the mask, a projection objective (sometimes also referred to as 'the lens') and a wafer alignment stage for aligning the wafer coated with the photoresist. The projection objective images, usually at a reduced scale, a portion of the circuit pattern, which is illuminated on the mask by the illumination system, on the photoresist.

One of the main aims in the development of microlithographic projection exposure apparatus is to be able to lithographically define features with smaller and smaller dimensions on the wafer. Small features lead to a high integration density, which generally has a favorable effect on the performance of the microstructured components that are produced with the aid of such apparatus.

The minimum size of the features that can be lithographically defined is approximately proportional to the wavelength of the projection light. Therefore the manufacturers of such apparatus strive to use projection light having shorter and shorter wavelengths. The shortest wavelengths currently used are 248 nm, 193 nm and 157 nm and thus lie in the deep ultraviolet (DUV) or vacuum ultraviolet (VUV) spectral range.

The next generation of commercially available apparatus is expected to use projection light having an even shorter wavelength of about 13.4 nm which is in the extreme ultraviolet (EUV) spectral range. Because there are generally no optical materials available that are transparent for EUV light, it is not generally possible to use lenses or other refractive optical elements in such an apparatus. Instead, the optical systems of such an apparatus are typically catoptric, which means that all optical elements (including the mask) have to be reflective.

The illumination system of an EUV projection exposure apparatus typically includes one or more multi facet mirrors. A multi facet mirror includes a plurality of mirror members (occasionally referred to as mirror facets) each having a flat or curved reflecting surface. Sometimes the EUV illumination system includes one multi facet mirror that is used to determine the intensity distribution in a pupil surface of the illumination system. This intensity distribution, in turn, determines from which direction EUV projection light impinges on the mask. Changing these directions involves tilting the mirror members of the multi facet mirror. Another multi facet mirror is often used to produce a plurality of secondary light sources that commonly illuminate the mask. In principle, a multi facet mirror may also be used in the projection objective, for example at a position in or in close proximity to a pupil surface.

Some multi facet mirrors include mirror members which can be adjusted individually with the help of actuators. Such a multi facet mirror is described in US 2005/0030653 A1. Each mirror member of this prior art multi facet mirror has a substrate which has at least approximately the shape of a truncated ball. The truncation defines a flat or curved area on which a reflective coating is applied. The substrate is connected to an actuating rod having a longitudinal axis which coincides with an axis of symmetry of the ball-shaped substrate. A support plate of the multi facet mirror is provided with a plurality of sockets for the ball-shaped substrates. The actuating rod extends through the socket and projects from a bottom surface of the support plate. This projecting portion of the actuating rod is connected to an actuator which is configured to move the actuating rod laterally. Lateral displacements of the free end of the actuating rod cause tilting movements of the entire mirror member.

US 2009/0225297 A1 describes an actuator for a lens that includes three actuator members which are evenly distributed along the circumference of the lens. Each actuator member includes three piezoelectric stacks that are arranged one on top of the other. One stack is capable of changing its length along one direction, and the other two stacks are capable of performing shearing deformations along two further directions. If all these directions are orthogonal to each other, the lens can be moved along arbitrary directions and also be tilted around certain tilting axes.

WO 2010/037476 A2 describes the use of ultrasonic transducers to tilt mirror members of a multi facet mirror.

If the density of the mirror members in such multi facet mirrors is very high, the volume which is available for accommodating a single actuator becomes very small. Particularly if the range of possible tilting angles shall be large, it is difficult to arrange an actuator at one side of the actuating rod within a volume that is laterally confined (at least approximately) by the circumference of the mirror substrate.

SUMMARY

The disclosure provides a multi facet mirror of a microlithographic projection exposure apparatus in which actuators for tilting the mirror members have very small lateral dimensions so that the mirror members can be densely packed.

According to a first aspect of the disclosure, a multi facet mirror includes a plurality of mirror facet units. Each mirror facet unit includes a mirror member including a mirror body, a reflective coating provided at a first end of the mirror body and an actuating surface provided at a second end of the mirror body which is arranged opposite the first end. The mirror facet unit further includes a bearing for the mirror member defining a tilting axis, a rest member on which the actuating surface rests while the mirror member is not moving, and an actuator. The actuator is configured to tilt the mirror member about the tilting axis and includes a contact surface and a lifting member. The lifting member is configured to move the actuating surface along a lifting direction. In a first operating state of the lifting member the actuating surface rests at least mainly on the rest member. In a second operating state of the lifting member the actuating surface rests at least mainly on the contact surface. The actuator further includes a displacement member which is configured to displace the contact surface along a lateral direction which forms an angle distinct from 0° to the lifting direction only while the lifting member is in the second operating state.

If the lifting member and the displacement member are both configured to perform oscillating movements which are synchronized to each other, it is possible to tilt the mirror member very rapidly by large tilting angles.

The disclosure is based on the perception that the tight restrictions with regard to the volume which is available for a single actuator can only be met if the tilting movement is divided into a plurality of small steps. Then each of these steps is associated with a small displacement, and consequently no part of the actuator has to perform the same large movement as the mirror member does during the whole tilting process.

The concept of dividing a larger movement in a sequence of small steps is known in the art as such (see US 2009/0225297 A1 that has been mentioned above). However, if one applies this concept to the problem of tilting a mirror member of a multi facet mirror, this would result in a configuration in which three actuating members are distributed along the circumference of the mirror substrate. Such an actuator would have very large lateral dimensions of the actuator so that the mirror members cannot be densely packed.

According to the disclosure, the actuators do not act on a circumference of the mirror substrate, but on an actuating surface which is arranged opposite the mirror substrate. This makes it possible to arrange the actuator underneath the mirror substrate. If the mirror body includes a substrate on which the reflective coating is supplied, a plate on which the actuating surface is formed, and a rod that connects the substrate to the plate, the actuator may even be arranged underneath the actuating surface so that the lateral dimensions of the actuator can be kept very small. In the context of the present disclosure a rod is any elongated member having a length that exceeds its width measured perpendicularly thereto.

If the actuating surface is convexly curved, the distance between the actuating surface and the contact surface will not vary significantly if the mirror member is tilted.

The actuating surface may have, in a plane perpendicular to the tilting axis, a circular arc profile wherein the center of curvature is located on the tilting axis. In this case the actuating surface does not change its distance to the contact surface if the mirror member is tilted. If there are two orthogonal tilting axes, the actuating surface may be spherical, with the centre of curvature coinciding with the point where the two tilting axes intersect.

A very precise lifting and displacement of the mirror member is possible if the lifting member and the displacement member are formed by piezoelectric stacks. In one embodiment the stacks are arranged one on top of one another to form a multi-axis piezoelectric component. The contact surface will then be formed on the uppermost stack of this component.

The lifting member may be integrated into the rest member so that the rest member, or a portion of it, moves along the lifting direction. The contact surface may then be formed on the displacement member which is not integrated into the rest member.

In some embodiments the mirror facet unit includes a preload device that is configured to exert a preload force which presses the actuating surface against the rest member at least if the lifting member is the first operating state. Such a preload device ensures that, irrespective of the direction of gravity forces, there is sufficient friction between the actuating surface and the rest member so that the mirror member is kept in place by the frictional forces. If the preload device exerts the pressure also in the second operating state, it increases also the friction during movements of the contact surface.

The preload device may include a resilient member, for example a spring, or a controllable pressure member, for example a piezoelectric stack.

The rest member may at least partially surround the displacement member. In particular the rest member may have an annular cross section perpendicularly to the lifting direction. In other embodiments the rest member includes a plurality of pillars that may have a cross-section having the shape of a ring segment. Surrounding the displacement member usually results in a configuration having an axial or n-fold symmetry which helps to achieve a reliable and accurate function of the mirror facet unit.

If the mirror member shall be tilted around a second tilting axis, the mirror facet unit may include a further displacement member which is configured to displace the contact surface along a direction which forms a second angle distinct from 0° to the lifting direction and third angle distinct from 0° to the lateral direction, only while the lifting member is in the second operating state.

If the lifting member and the two displacement members are formed by piezoelectric stacks, these stacks may also be arranged one on top of the other to form a multi-axis piezoelectric component.

It should be noted that also in the first operating state of the lifting member there may be some contact between the actuating surface and the contact surface. However, also in this case the frictional forces acting between the actuating surface and the rest member should suffice to keep the actuating surface in place so that the mirror member cannot tilt.

Multi facet mirrors are not only used in EUV projection exposure apparatus, but also in the illumination systems of DUV or VUV apparatus. In such systems the multi facet mirrors can be freely tilted about two orthogonal tilting axes and are used to define the intensity distribution in a pupil surface of the illumination system. Several embodiments of such a multi facet mirror are described in WO 2005/026843 A1. The present disclosure can also be used in such DUV or VUV projection exposure apparatus.

Furthermore, the disclosure may also be used for tilting mechanical components other than mirror members.

According to a second aspect of the disclosure, a multi facet mirror of a microlithographic projection exposure apparatus includes a plurality of mirror facet units. Each mirror facet unit includes a tiltable mirror member, a bearing for the mirror member defining a tilting axis and an actuator that is configured to tilt the mirror member about the tilting axis. The actuator includes a displacement member which is configured to perform oscillating movements and a press and release system which is configured to intermittently press the mirror member and the displacement member against each other at displace times which are synchronized with the oscillating movement of the displacement member.

The disclosure according to this second aspect is also based on the perception that the tight restrictions with regard to the volume which is available for a single actuator can only be met if the tilting movement is divided into a plurality of small steps. Then each of these steps is associated with a small displacement, and consequently no part of the actuator has to perform the same large movement as the mirror member during the whole tilting process.

The press and release system may be synchronized in such a manner that the displacement member moves only along one of two opposite directions during the displace times if a tilt movement of the mirror member along one tilt direction is desired.

The mirror member may include a mirror body, a reflective coating provided at a first end of the mirror body and an actuating surface provided at a second end of the mirror body which is arranged opposite the first end. The displacement member may then be configured to be pressed against the actuating surface only during the displacement times.

BRIEF DESCRIPTION OF THE DRAWINGS

Various features and advantages of the disclosure may be more readily understood with reference to the following detailed description taken in conjunction with the accompanying drawing in which:

FIGS. 11 to 14 are top views and cross-sections through rest members according to various alternative embodiments;

DESCRIPTION OF PREFERRED EMBODIMENTS

I. General Construction of Projection Exposure Apparatus

Figure 1:
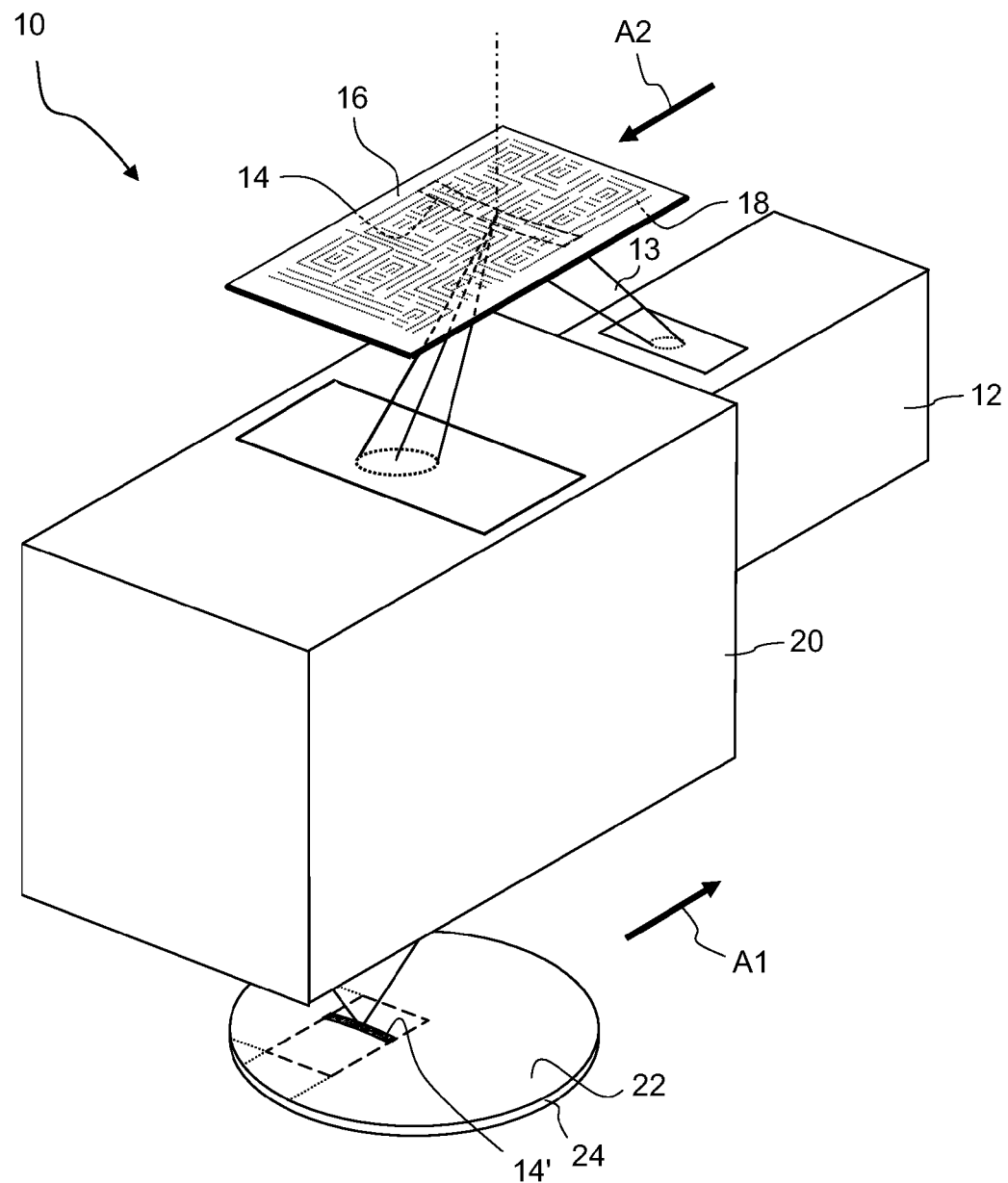
FIG. 1 is a perspective schematic view of an EUV microlithographic projection exposure apparatus in accordance with the present disclosure.

FIG. 1 is a perspective and highly simplified view of a EUV projection exposure apparatus 10 which is designed in accordance with the present disclosure. The apparatus 10 includes an illumination system 12 which produces a beam 13 of projection light that has a wavelength in the EUV spectral range, for example 13.4 nm. The beam 13 illuminates from below a field 14 on a mask 16 which contains on its underside a reflective pattern 18 formed by a plurality of small features. In this embodiment the illuminated field 14 has the shape of a ring segment.

A projection objective 20 images the pattern 18 within the illuminated field 14 onto a light sensitive layer 22 which is supported by a substrate 24. Typically the light sensitive layer 22 is a photoresist and the substrate 24 is a silicon wafer. The substrate 24 is arranged on a wafer stage (not shown) such that a top surface of the light sensitive layer 22 is precisely located in an image plane of the projection objective 20. The mask 16 is positioned by means of a mask stage (not shown) in an object plane of the projection objective 20. Since the latter has a magnification $\beta$ with $|\beta|<1$, a minified image 14' of the pattern 18 within the illuminated field 14 is formed on the light sensitive layer 22.

Because there are generally no optical materials available that are transparent for EUV projection light, it is generally not possible to use lenses or other refractive optical elements in the apparatus 10. Instead, the illumination system 12 and the projection objective 20 contain only mirrors as optical elements (apart from stops). Also the mask 16 is reflective.

During the projection the mask 16 moves along a scan direction which coincides with the Y direction indicated in FIG. 1. The illuminated field 14 then scans over the mask 16 so that patterned areas larger than the illuminated field 14 can be continuously projected. If the projection objective 20 inverts the image ($\beta<0$), the mask 16 and the substrate 24 move along opposite directions during the projection, as this is indicated in FIG. 1 by arrows A1 and A2. If the projection objective 20 does not invert the image ($\beta>0$), the mask and the substrate 24 move along the same direction. In either case the ratio between the velocities of the substrate 24 and the mask 16 is equal to the magnification $\beta$ of the projection objective 20.

However, the present disclosure may also be used in stepper tools in which the mask 16 and the substrate 24 do not move during projection of the mask.

II. Multi Facet Mirror

The illumination systems of DUV or VUV projection exposure apparatus often contain fly's eyes lenses or other optical raster elements such as diffractive optical elements. In the EUV illumination system 12 shown in FIG. 1 the task of optical raster elements is taken over by multi facet mirrors including a plurality of individual mirror members.

Figure 2:
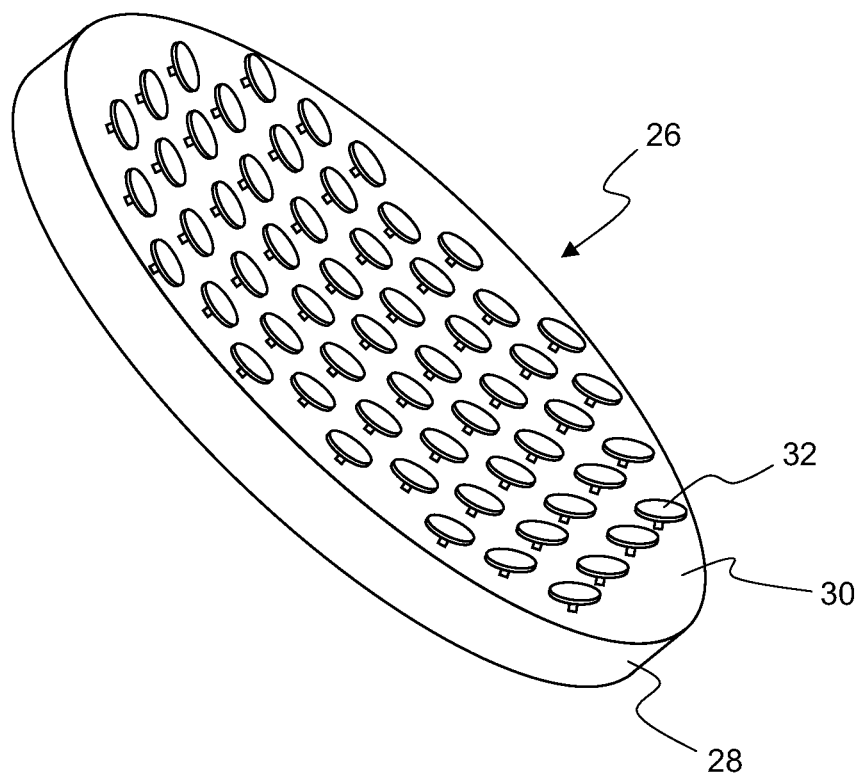
FIG. 2 is a simplified perspective view of a multi facet mirror according to one embodiment of the present disclosure including mirror facets that are attached to a support plate.

FIG. 2 is a perspective view of a multi facet mirror contained in the illumination system 12 and denoted in its entirety by 26. The multi facet mirror 26 includes a support structure 28 having a cover plate 30 from which a plurality of mirror members 32 project. As will be explained in the following section III in more detail, each mirror member 32 is part of a facet mirror unit which includes an actuator that is configured to tilt the mirror member about two orthogonal tilting axes. Thus light impinging on one of the mirror members 32 is reflected into directions that depend on the tilting angles that have been set for the particular mirror member 32.

It should be noted that in a real multi facet mirror 26 the density of the mirror members 32, and thus of the mirror facet units, is usually much higher. This severely restricts the volume which is available to accommodate the actuator and other components of each mirror facet unit.

III. Mirror Facet Units

Figure 3:
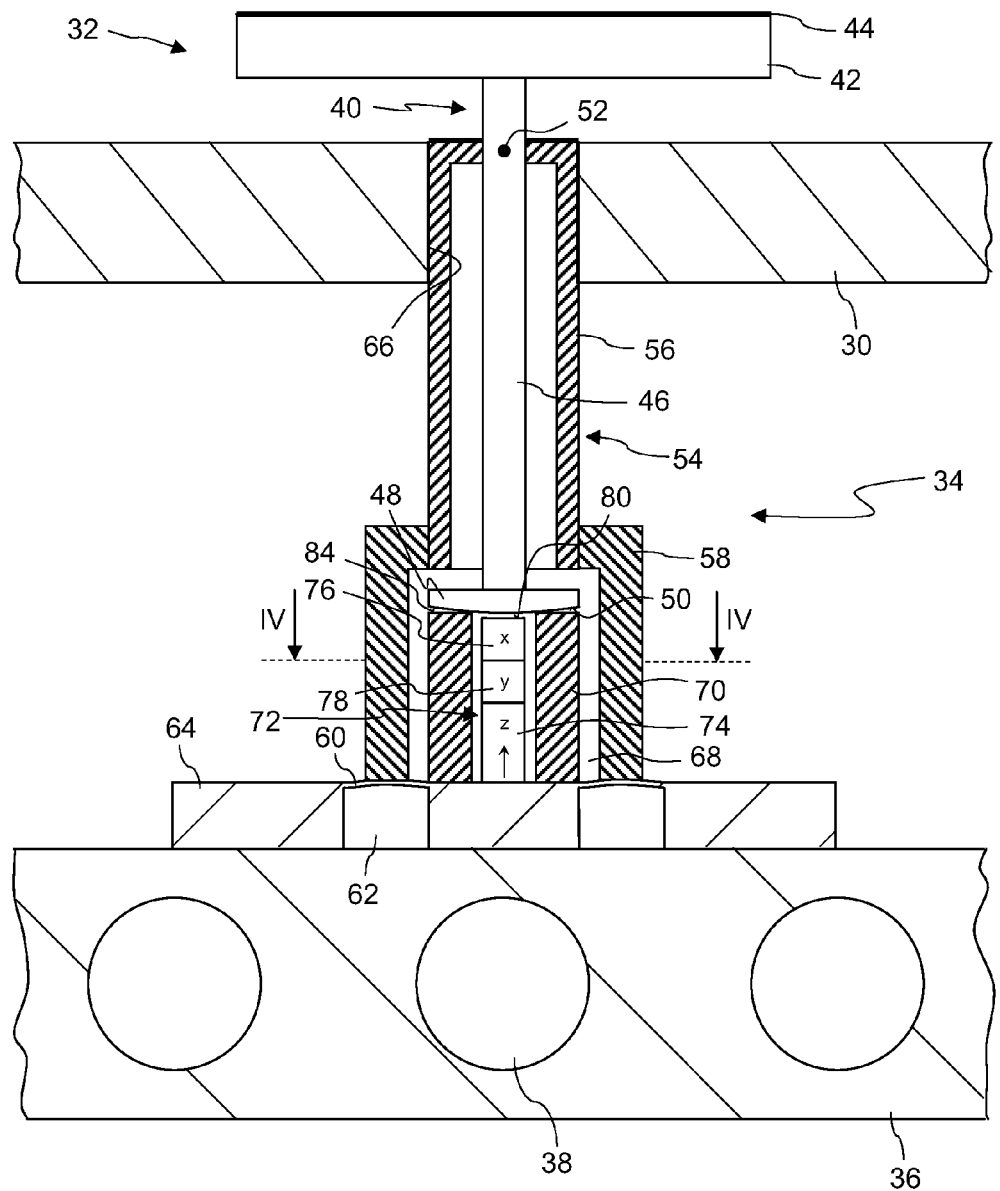
FIG. 3 is a partial cross-section through the multi facet mirror shown in FIG. 2.

FIG. 3 is a schematic and not-to-scale cross-section through one of the mirror facet units that are contained in the multi facet mirror 26 shown in FIG. 2. The mirror facet unit, which is denoted in its entirety by 34, is arranged between the cover plate 30 and a base plate 36 which is also part of the support structure 28. A plurality of cooling channels 38 extend through the base plate 36 that may have a circular cross section. During operation of the apparatus 10, a fluid, for example a liquid such as water, flows through the cooling channels 38 so that heat, which has been generated by the absorption of projection light, is convectively removed from the multi facet mirror 26.

The mirror member 32 being part of the mirror facet unit 34 includes a mirror body 40 which is a rigid structure which may be made of steel or another metal, for example. The mirror body 40 includes a substrate 42 on which a reflective coating 44 is applied, a rod 46 and a plate 48. In the embodiment shown the top surface of the substrate 42 is plane; in other embodiments the substrate 42 may have a curved top surface on which the reflective coating 44 is applied. The substrate 42 is connected via the rod 46 to the plate 48 which has a circular circumference. The surface of the plate 48 pointing downward in FIG. 3 and thus away from the reflective coating 44 is spherically curved. The centre of curvature of this surface, which will be referred to in the following as actuating surface 50, coincides with a point where the two orthogonal tilting axes cross each other. In FIG. 3 this point is indicated by a small dot 52.

The tilting axes crossing at the point 52 are, in turn, defined by a bearing 54 which surrounds a portion of the rod 46 and has approximately the shape of a stepped sleeve including a first portion 56 having a smaller inner and outer diameter and a second portion 58 having a wider inner and outer diameter. Both portions 56, 58 may be formed as separate parts as shown or integrally by a single part.

The second portion 58 of the bearing 54 rests on a preload device 60. The preload device 60 is formed by a thin circular bridge which extends over a circular recess 62 which is formed in a support plate 64 of the mirror facet unit 34. The bridge has resilient properties and is configured such that it exerts a tensile force on the bearing 54. As a result of this tensile force, the bearing 54 and the mirror body 40 connected to it at the tilting axes are permanently drawn towards the support plate 64. In order to enable small longitudinal movements of the bearing 54 and the mirror body 40, a bore 66 in the cover plate 30, through which the bearing 54 extends, may have a slightly larger diameter than the outer diameter of the first portion 56 of the bearing 54 so as to achieve a loose fit.

Figure 4:
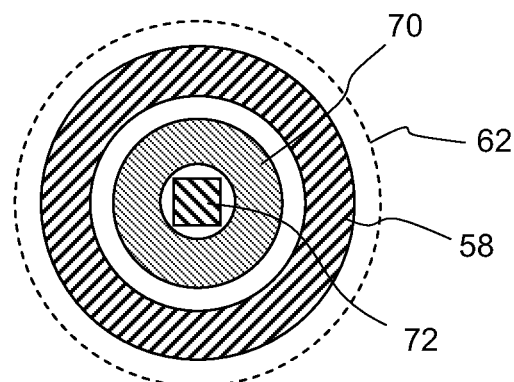
FIG. 4 is a top view on a portion of a facet mirror unit shown in FIG. 3 along line IV-IV.

The second portion 58 of the bearing 54 defines a cavity 68 which accommodates a rest member 70 and an actuator 72. As can be seen in the cross section of FIG. 4 along line IV-IV, the rest member 70 of this embodiment has the shape of a sleeve having a longitudinal axis which coincides with the longitudinal axis of the bearing 54 and in particular of its second portion 58. The actuator 72 is, in turn, accommodated in a cavity which is formed inside the rest member 70.

The actuator 72 includes a lifting member 74, a first displacement member 76 and a second displacement member 78. The lifting member 74 is configured such that it can change its length along the Z direction which coincides with the longitudinal axis of the bearing 54 and of the rest member 70. The first displacement member 76 is configured such that it can perform a shearing deformation along an orthogonal X direction; for that reason it is indicated in FIG. 3 with an "x". The second displacement member 78 is configured such that it can perform a shearing deformation along a Y direction which is orthogonal to the X and Z direction; for that reason it is indicated in FIG. 3 with a "y".

In the embodiment shown the lifting member 74 and the displacement members 76, 78 are formed by piezoelectric stacks similar to those that are described in the aforementioned document US 2009/0225297 A1. Each member 74, 76, 78 can be controlled individually so that a contact surface 80, which is in this embodiment the top surface of the first displacement member 76, can be moved parallel to the Z direction and parallel to XY planes which are orthogonal to the Z direction. In the operating state shown in FIG. 3 the contact surface 80 of the actuator 72 is located in immediate vicinity to the actuating surface 50 of the mirror body 40.

VI. Function of Mirror Facet Units

In the following it will be described with reference to FIGS. 3 to 10 how the mirror member 32 can be tilted with the help of the actuator 72. FIGS. 4 to 10 show the mirror facet unit 34 in different operating states.

In FIG. 3 the lifting member 74 is in a first operating state in which the lifting member 74 has its minimum length along the Z direction. Then the contact surface 80 is retracted so that it is not in contact, or at most in slight contact only, with the actuating surface 50 of the mirror body 40. Instead, the actuating surface 50 of the mirror body 40 rests exclusively, or at least mainly, on the rest member 70. Due to the preload exerted by the preload device 60 the actuating surface 50 is pressed against the rest member 70 to such an extent that friction between the actuating surface 50 and the rest member 70 suffices to prevent any movement of the mirror body 40 around the tilting axes. The preload device 60 further ensures that this holds true even if the mirror facet unit 34 is mounted upside down so that gravity does not contribute to the friction between the actuating surface 50 and the rest member 70.

Figure 5:
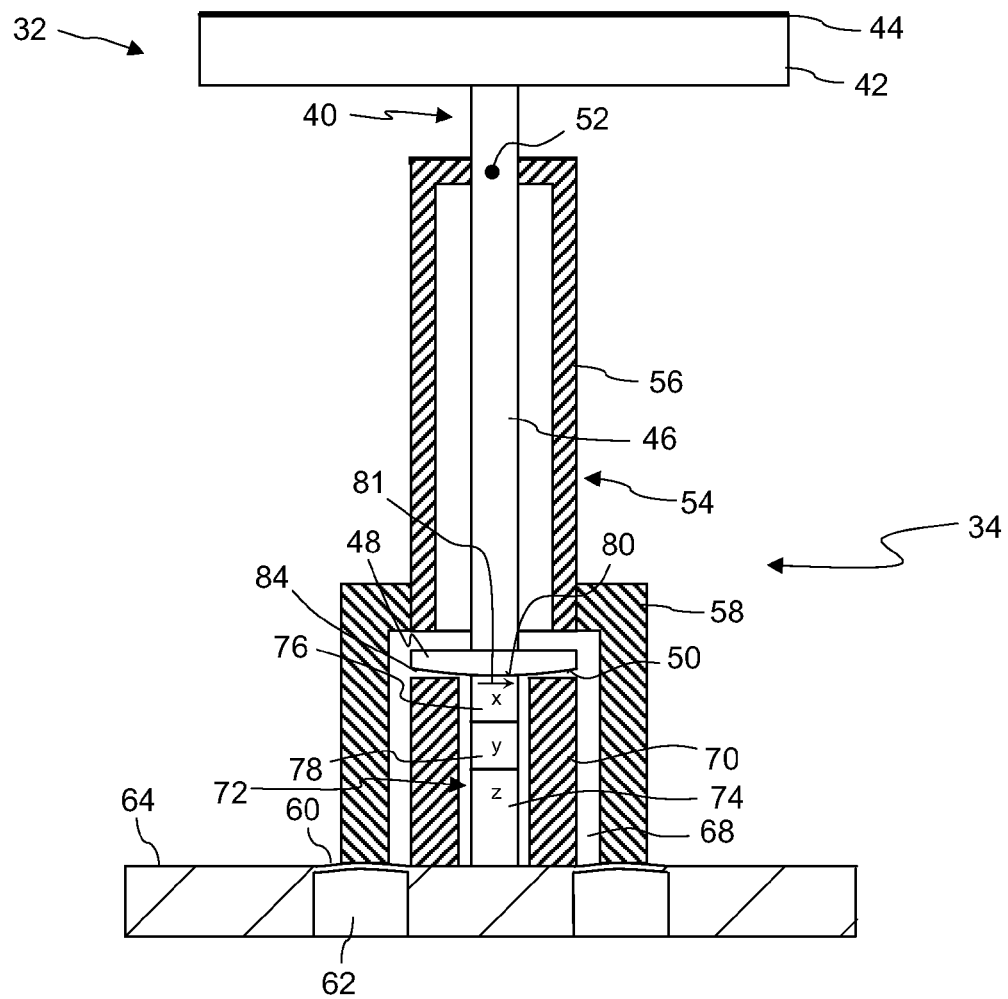
FIGS. 5 to 10 are cross-sections similar to FIG. 3 for different operating states of the mirror facet unit shown in FIG. 3.

FIG. 5 shows the lifting member 74 in a second operating state in which the lifting member 74 has its maximum length along the Z direction. While the lifting member 74 expands along the Z direction, the contact surface 80 of the actuator 72 will first come into contact with the actuating surface 50 of the mirror member 32. As the expansion continues, the lifting member 74 lifts the complete mirror member 32 and also the bearing 54 against the preload force produced by the preload device 60. As a result of this lifting movement, the actuating surface 50 of the mirror member 32 is lifted off the rest member 70, and consequently there are no more any frictional forces that fix the mirror body 40 at its original position. This state is shown in FIG. 5. The mirror member 32 is now free to perform tilt movements if the contact surface 80 is displaced laterally, i.e. in an XY plane which is perpendicular (i.e. forming an angle equal to 90°) to the lifting direction Z. A lateral movement of the contact surface 80 along the X direction is indicated in FIG. 5 by an arrow 81.

Figure 6:
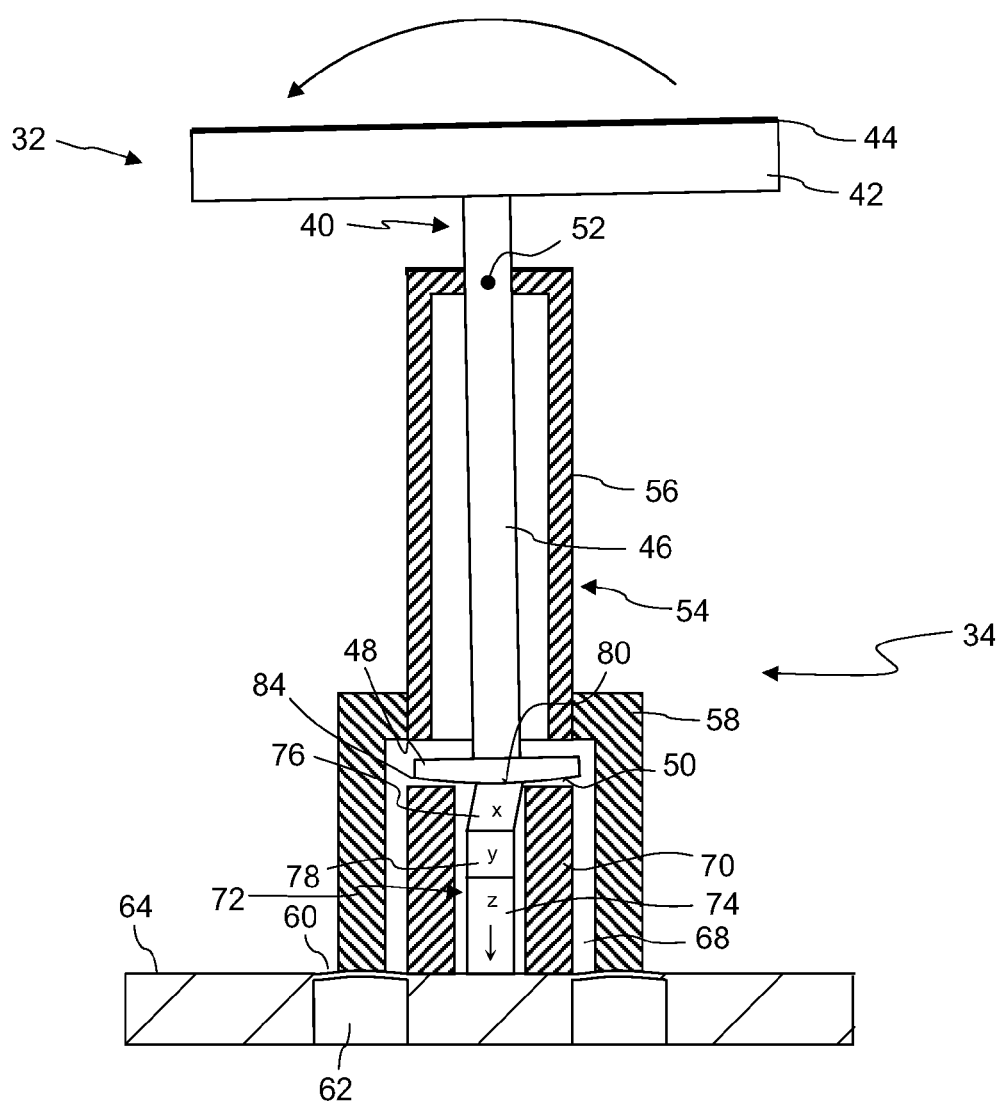

FIG. 6 shows the mirror facet unit 34 in the second operating state of the lifting member 72, but with an additional shearing deformation of the first displacement member 76 that results in the lateral displacement of the contact surface 80 indicated by arrow 81 in FIG. 5. Since the mirror member 32 completely (or at least mainly) rests with its actuating surface 50 on the contact surface 80 of the actuator 72, the lateral displacement of the contact surface 80 causes a tilting movement of the mirror member 32 around a tilting axis which is parallel to the Y direction. This tilting axis runs perpendicular to the drawing sheet through point 52. As a matter of course, also the reflective coating 44 on the substrate 42 will be tilted around this tilting axis.

The tilting angle is limited by the maximum displacement of the contact surface 80 which can be achieved with the first displacement member 76. For larger tilting angles the tilting action described above has to be repeated until the desired tilting angle is set.

Figure 7:
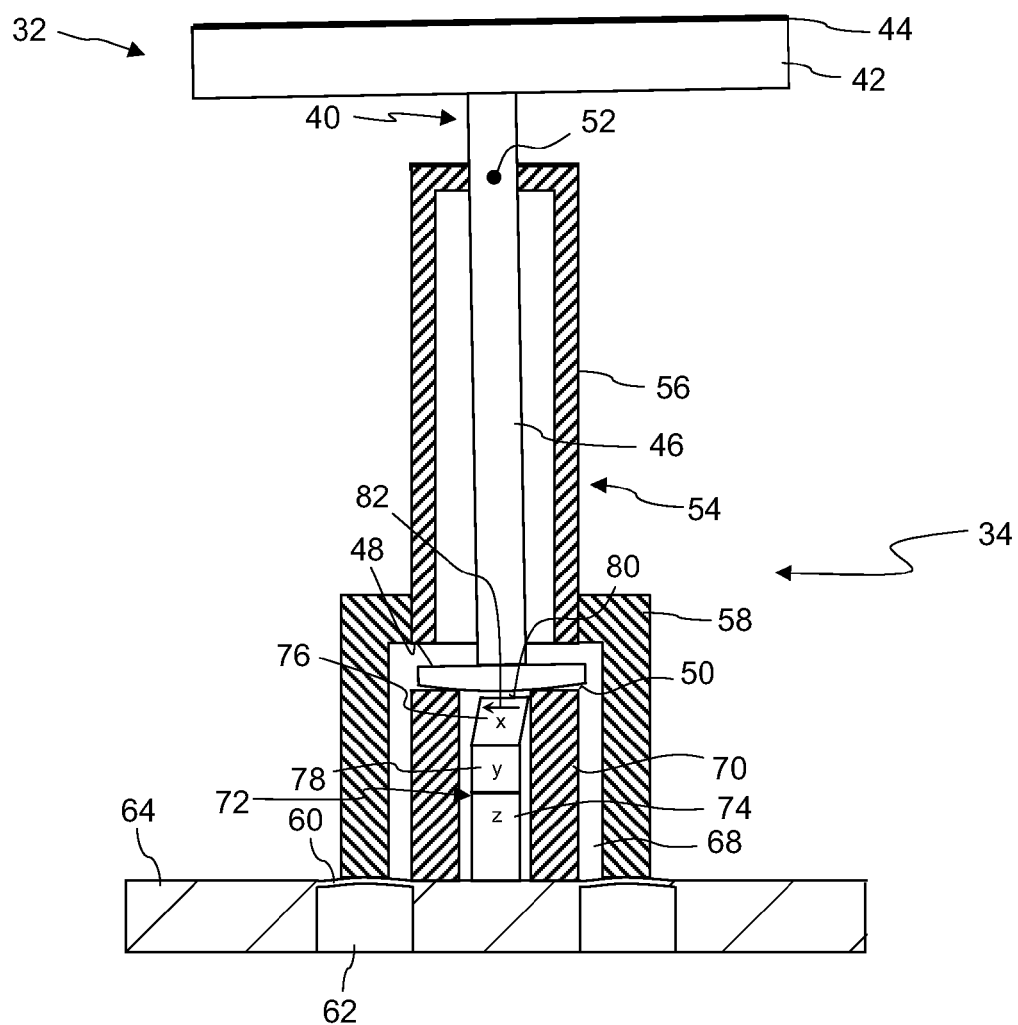

FIG. 7 illustrates a state after the lifting member 72 has contracted again. This permits the mirror body 40 to drop down on the rest member 70 where it is held in place by frictional forces. Since the contact surface 80 is again spaced apart from the actuating surface 50, the first displacement member 76 is free to return to its original state, as it is indicated in FIG. 7 by an arrow 82.

Figure 8:
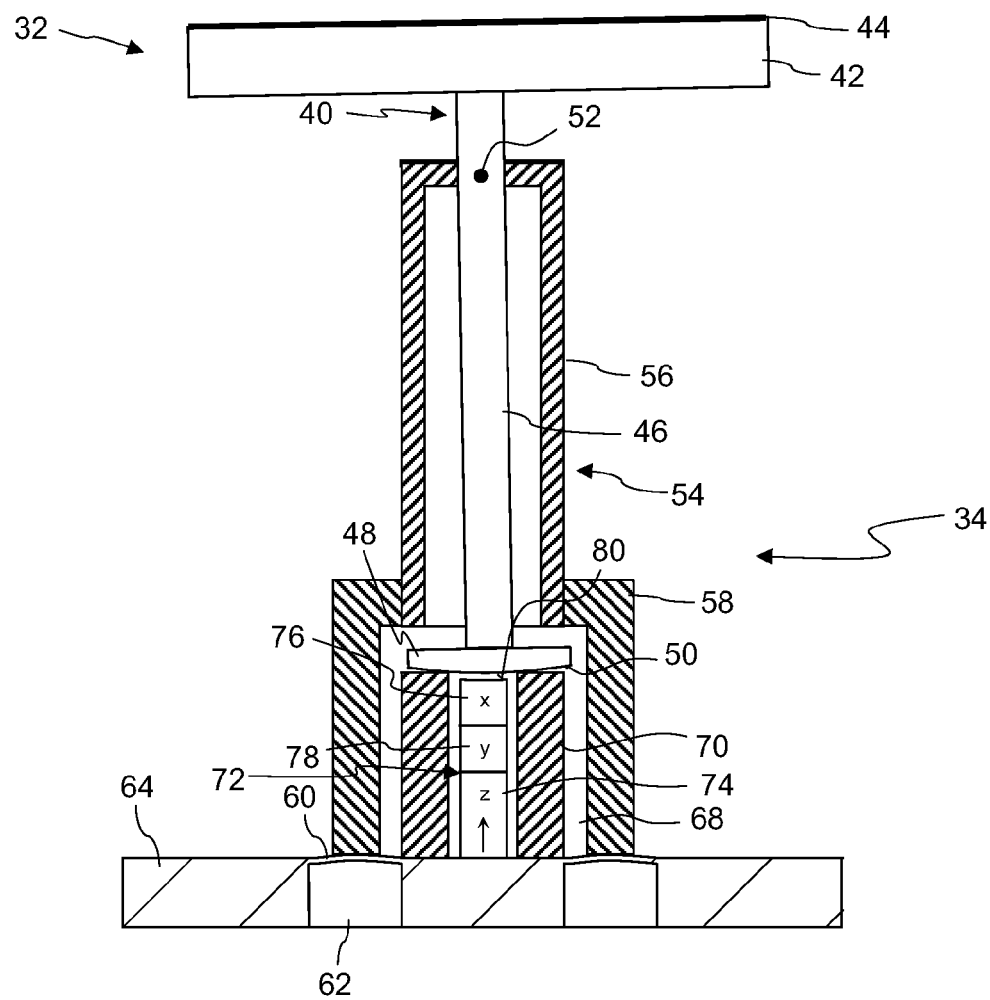
Figure 9:
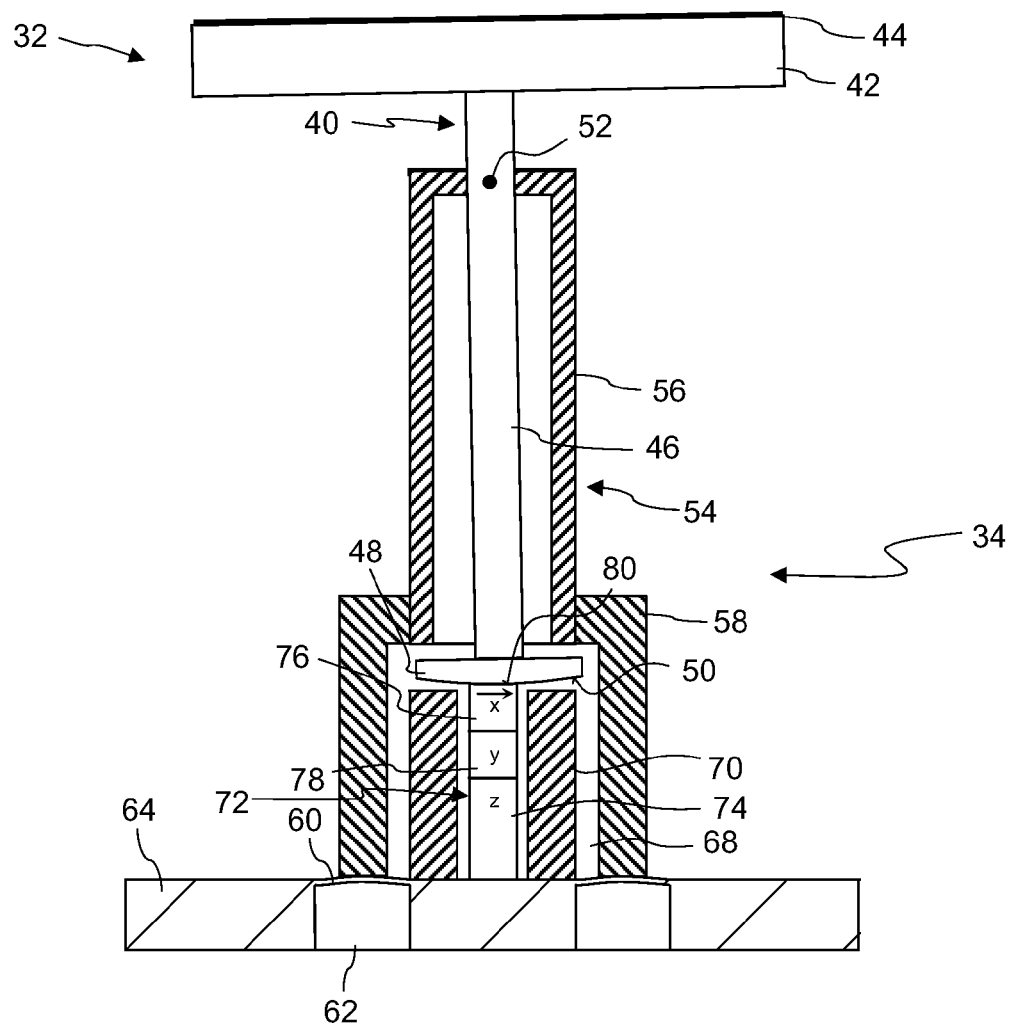
Figure 10:
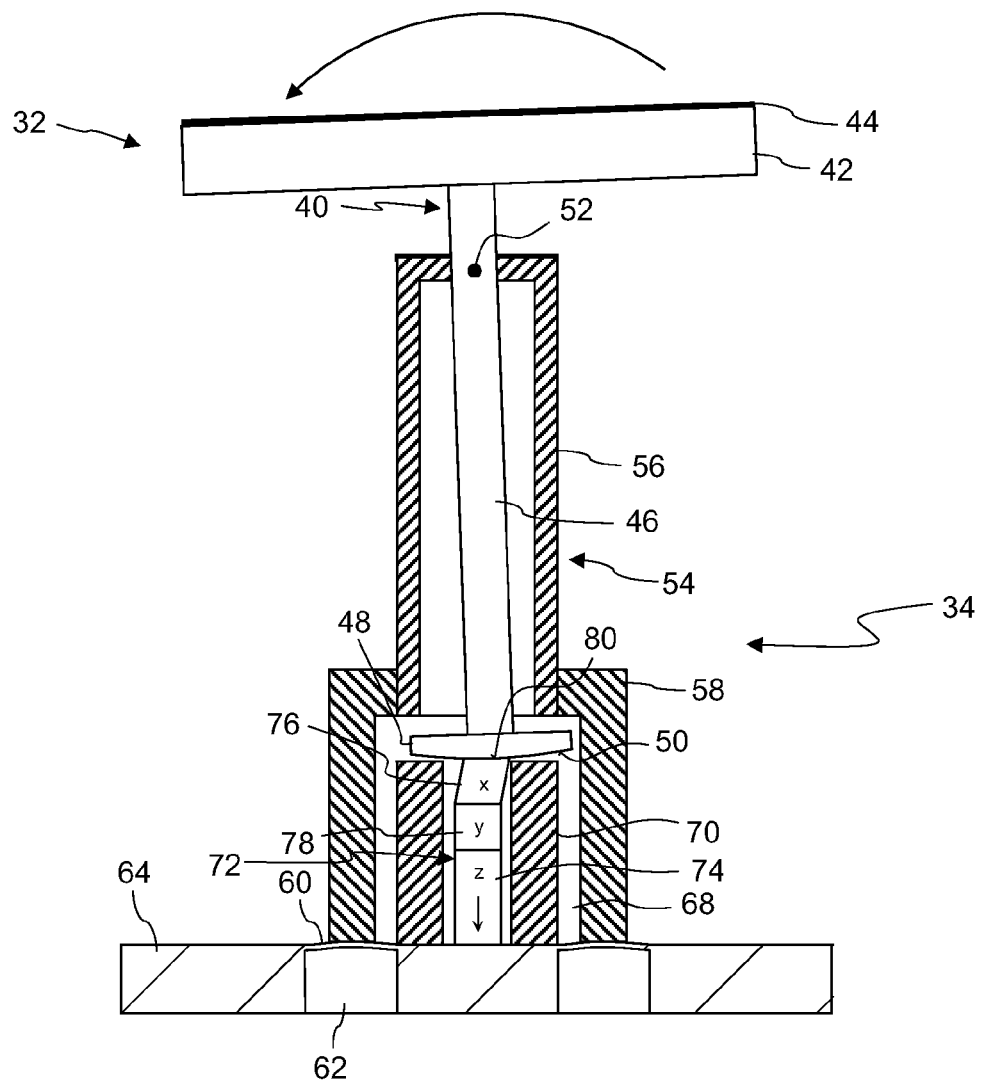

FIG. 8 shows the mirror facet unit 34 in this configuration. The configuration is identical to what is shown in FIG. 3 except that the mirror member 32 has already been tilted. Now the process described above with reference to FIGS. 5 and 6 is repeated. FIGS. 9 and 10 show the state of the mirror facet unit 34 with the lifting member 34 being again in the second operating state in which the contact surface 80 is in contact with the actuating surface 50 and the mirror member 32 is lifted off from the rest member 70.

A tilting of the mirror member 32 around an orthogonal tilting axis, i.e. an axis which is parallel to the X direction, may be performed in the same manner. To this end only the second displacement member 78 has to be used which is capable of displacing the contact surface 80 along the X direction. As long as the lifting member 74 is in the second operating state in which the actuating surface 50 rests at least mainly on the contact surface 80, both displacement members 76, 78 can be operated simultaneously so that a tilting movement of the mirror member 32 around an axis parallel to the Y direction can be superimposed with a tilting movement around an orthogonal axis.

If the members 74, 76 and 78 of the actuator 72 are configured as piezoelectric stacks or similar high precision actuating elements, the mirror member 32 can be tilted with very high accuracy. Although each single displacement of the contact surface 80, which can be produced by the displacement members 76, 78, is small, also large tilting angles can be set very rapidly, because the operation that has been described above with reference to FIGS. 3 to 10 can be performed at a very high repetition rate. For example, a complete cycle may be performed within one millisecond.

V. Alternative Embodiments

In the embodiment shown in FIGS. 3 to 10 the rest member 70 has a planar front surface 84 which extends in a XY plane that is arranged perpendicular to the longitudinal axis of the rest member 70. Since the actuating surface 50 of the plate 48 is convexly curved, the contact area between the actuating surface 50 and the front surface 84 of the rest member 70 has the shape of a circle, if the lifting member 74 is in the first operating state as shown in FIG. 3.

FIGS. 11 to 14 show different configurations of the front surface 84 of the rest member 70 according to alternative embodiments. It is assumed that the shape of the plate 48 is the same as in the embodiment described above with reference to FIGS. 3 to 10. Then the geometry of the contact area and thus the frictional forces, which keep the mirror member 32 in place while it rests on the rest member 70, depend only on the configuration of the front surface 84. Each of FIGS. 11 to 14 contains a top view on the rest member 70 showing its front surface 84 and a sectional view through the rest member 70 and the plate 48. The contact area is denoted by 86 and indicated with a dark filling.

In the embodiment shown in FIG. 11 the front surface 84 of the rest member 70 is concavely curved in a complementary fashion with regard to the actuating surface 50. Therefore the contact area 86 between the actuating surface 50 and the rest member 70 in this embodiment is equal to the total area of the front surface 84 of the rest member 70.

In the embodiment shown in FIG. 12 the front surface 84 of the rest member 70 is conically shaped in such a way that the contact area 86 has again the shape of a circle. However, this circle is now positioned not at the inner diameter of the rest member 70, but somewhere between the inner and the outer diameter, as it is shown in the top view of FIG. 12.

In the embodiment shown in FIG. 13 the rest member 70 is not formed by a sleeve, but by three pillars 88 that are angularly spaced apart by 120°. Each pillar 88 has a cross section having the geometry of a ring segment. The front surface 84 defined by the three pillars 88 is again conically shaped. However, unlike the embodiment shown in FIG. 12, the cone angle is determined in such a way that the contact area 86 is located near the outer diameter of the pillars 88.

In the embodiment shown in FIG. 14 the pillars 88 have a square cross section. The front surface 84 of the three pillars 88 is plane and extends in a plane which is perpendicular to the longitudinal direction of the pillars 88. For that reason the contact area 86 between the actuating surface 50 and the rest member 70 is confined to three points located at an inner edge of the pillars 88.

Figure 15:
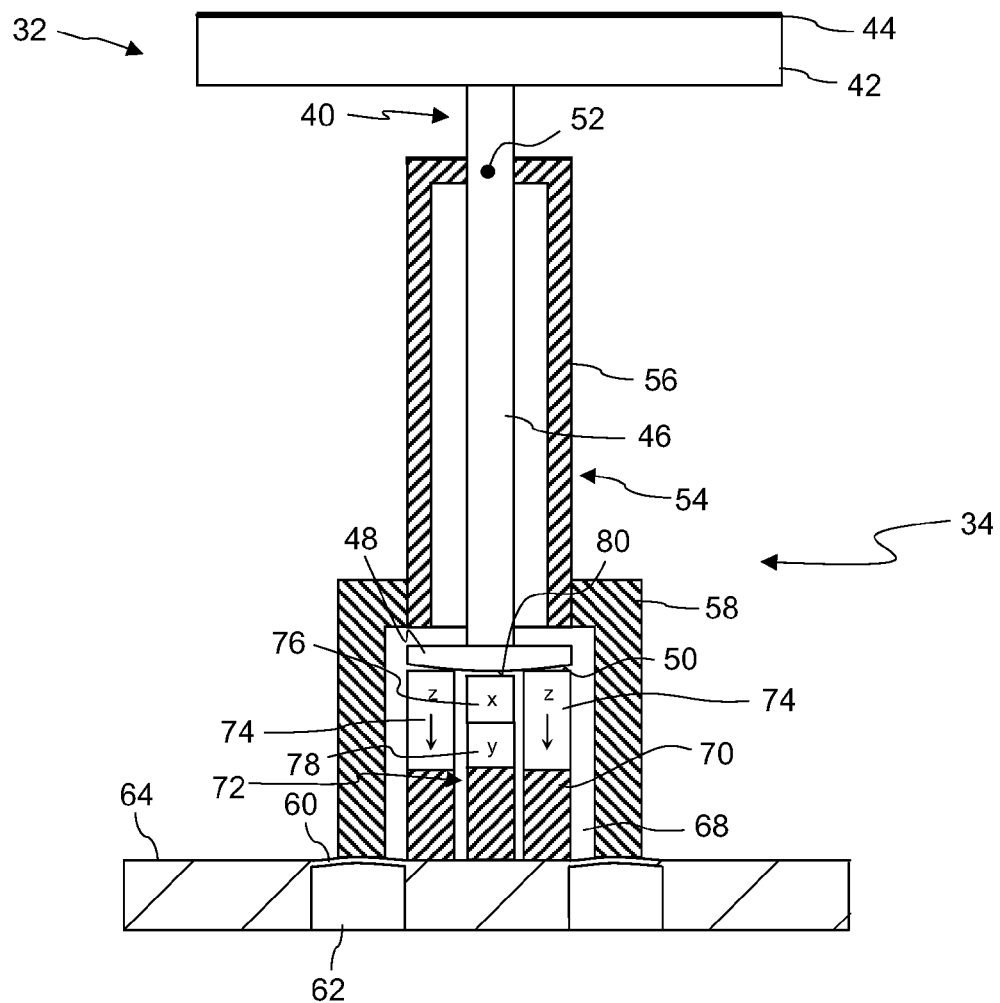
FIG. 15 is a partial cross-section through a multi facet mirror according to an alternative embodiment on which lifting members are arranged on top of the rest member.
Figure 16:
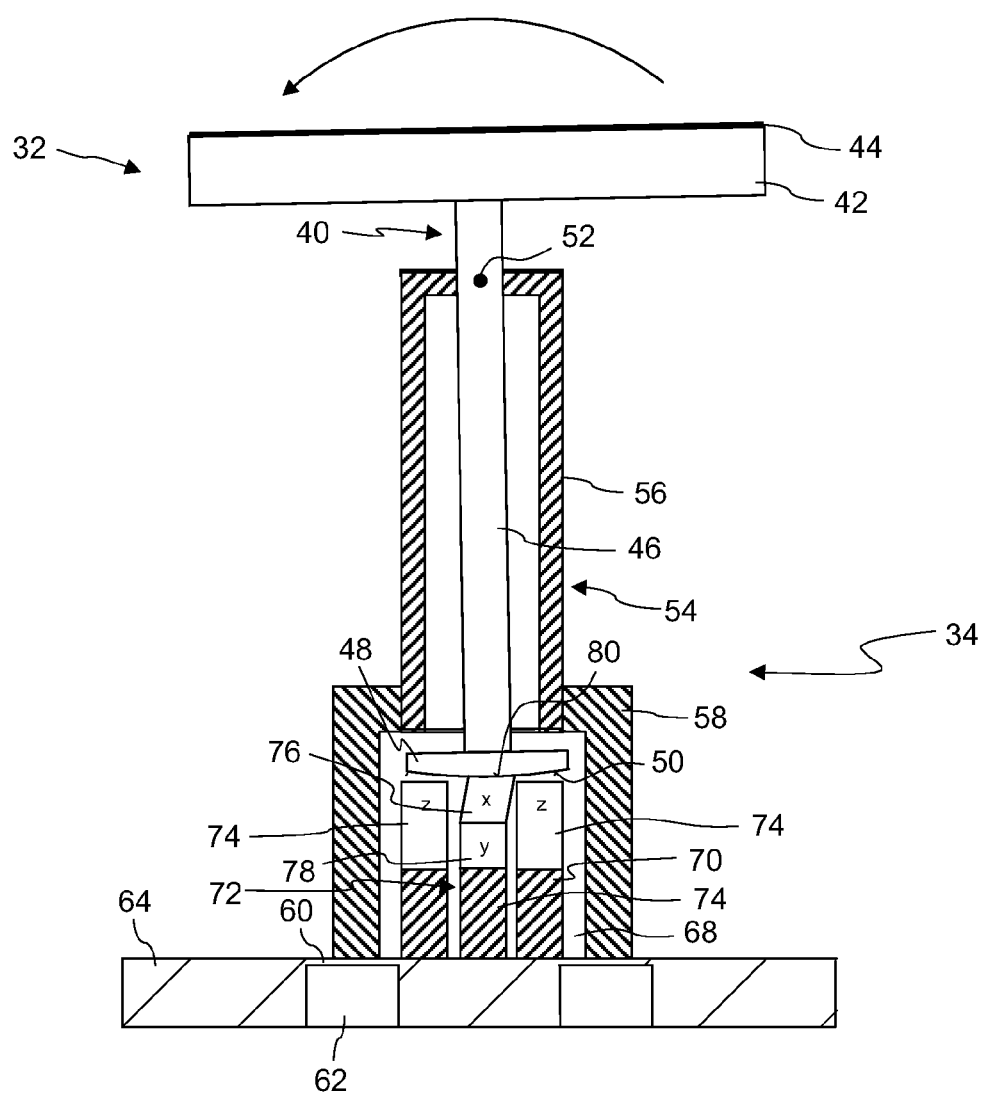
FIG. 16 shows the mirror facet unit of FIG. 15 in a different operating state.

FIGS. 15 and 16 show, in a representation similar to FIGS. 5 and 6, an embodiment in which lifting members 74 are integrated into the rest member 70. The rest member may have any of the configurations as shown in FIG. 4 or 11 to 14. In this embodiment the contact surface formed on top of the first displacement member 76 is not moved along the Z direction. In contrast to the embodiment shown in FIGS. 3 to 10, the first operating state, in which the actuating surface 50 rests at least mainly on the rest member 70, is obtained if the lifting members 74 have their maximum length, i.e. are in an extended configuration. In this first operating state, as it is shown in FIG. 15, the contact surface 80 is not in contact with the actuating surface 50 of the mirror member 32.

If the lifting members 74 are in their second operating state in which they are fully contracted, the contact surface 80 gets into contact with the actuating surface 50 of the mirror member 32, as it is shown in FIG. 16. Then the mirror member 32 can be tilted by displacing the contact surface 80 laterally with the help of the displacement members 76, 78.

Figure 17:
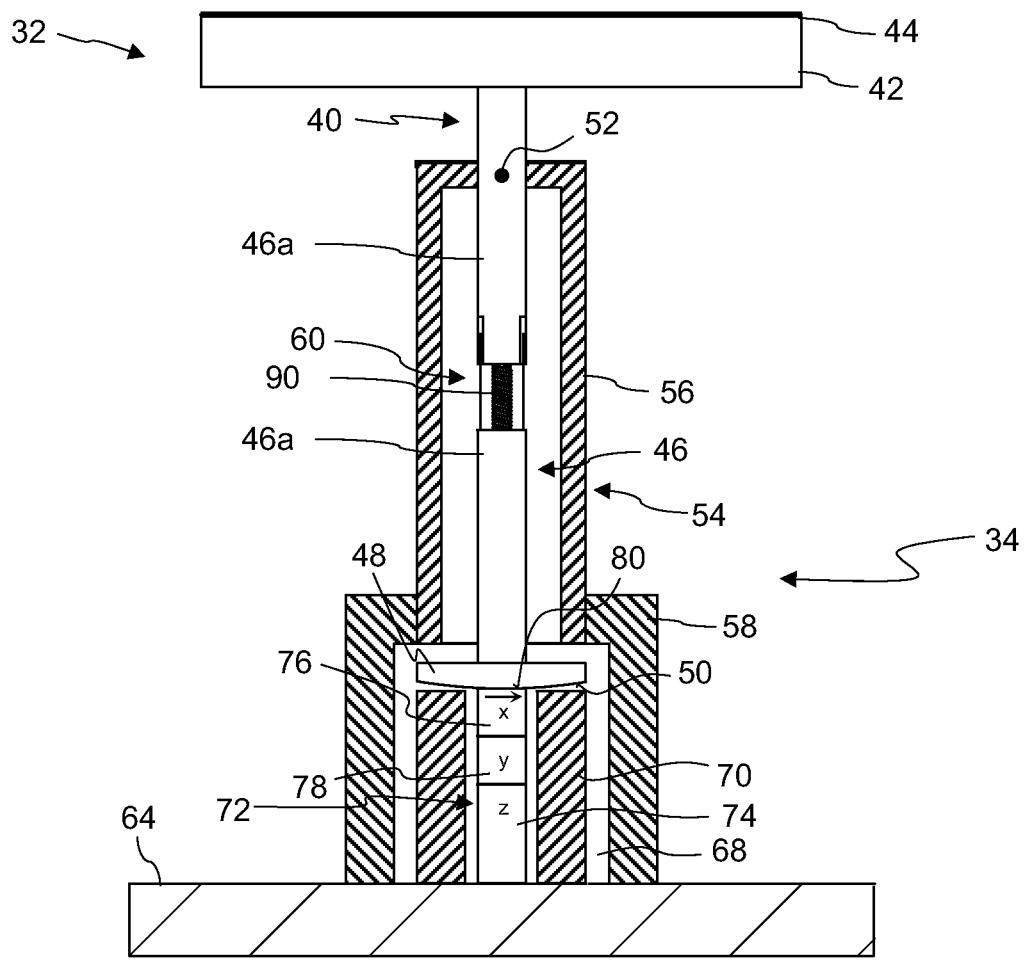
FIG. 17 is a partial cross-section through a multi facet mirror according to a further embodiment in which a preload force is produced by a resilient member integrated into the mirror body.

FIG. 17 shows an embodiment, in a representation similar to FIG. 5, in which the preload device 60 does not include a bridge which is part of the support plate 64, but includes a resilient member 90 which is integrated into the rod 46 of the mirror body 40. This has the advantage that the bearing 54 can be fixedly attached to the support plate 64 and press fitted into the cover plate 30. During tilting movements the substrate 42 of the mirror body 40 does not perform any movements along the Z direction, as it is the case in the embodiment described above. Instead, the length of the rod is reduced while the mirror member 32 is tilted. To this end the rod 46 may be divided into two portions 46a, 46b that can, as it is schematically shown in FIG. 17, be telescopically displaced with regard to each other so as to vary the overall length of the rod 46. The resilient member 90, which may be formed by a spring, ensures that the actuating surface 50 is always pressed against the contact surface 80 of the actuator 72 so as to always maintain a sufficient friction.

Figure 18:
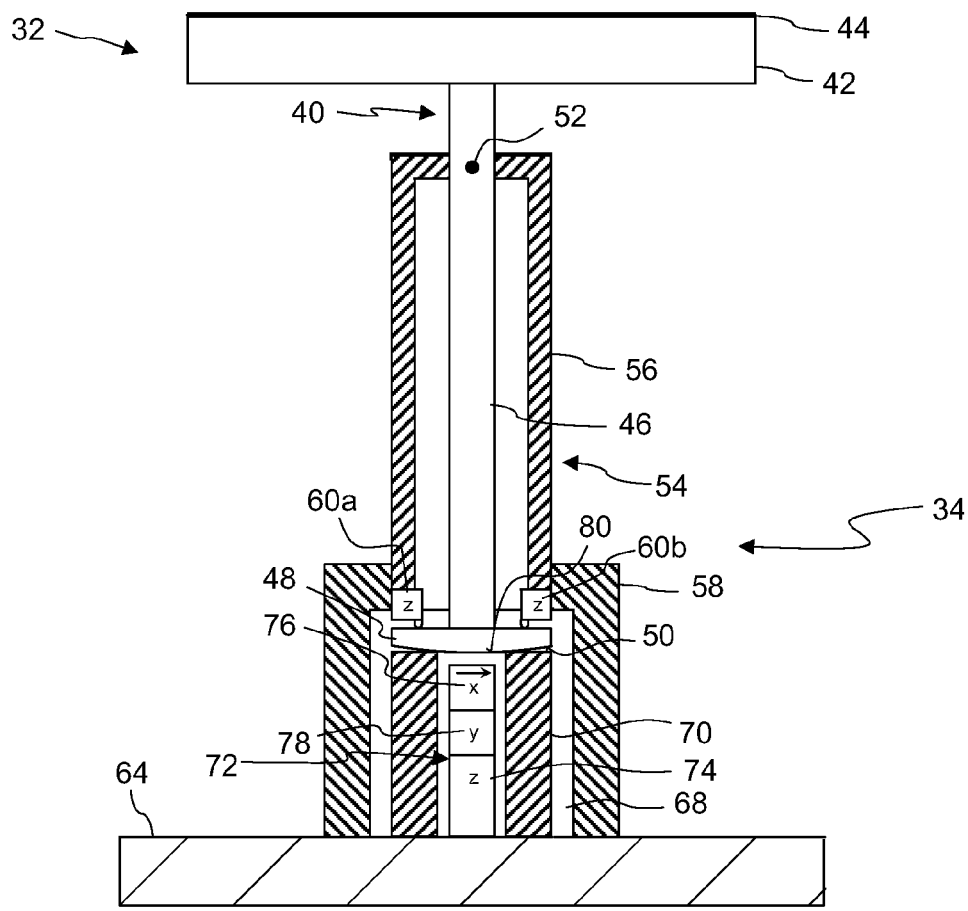
FIG. 18 is a partial cross-section through a multi facet mirror according to a further embodiment in which a preload force is produced by piezoelectric stacks.

FIG. 18 shows an embodiment, in a representation similar to FIG. 5, in which the preload device includes two piezoelectric stacks 60a, 60b that are configured to change their length along the Z direction. FIG. 18 shows the mirror facet unit 34 in the first operating state of the lifting member 74 in which the contact surface 80 is spaced apart from the actuating surface 50. To maintain a sufficient friction between the actuating surface 50 and the rest member 70, the piezoelectric stacks 60a, 60b are controlled in such a manner that they exert a pressure force on the top side of the plate 48.

Figure 19:
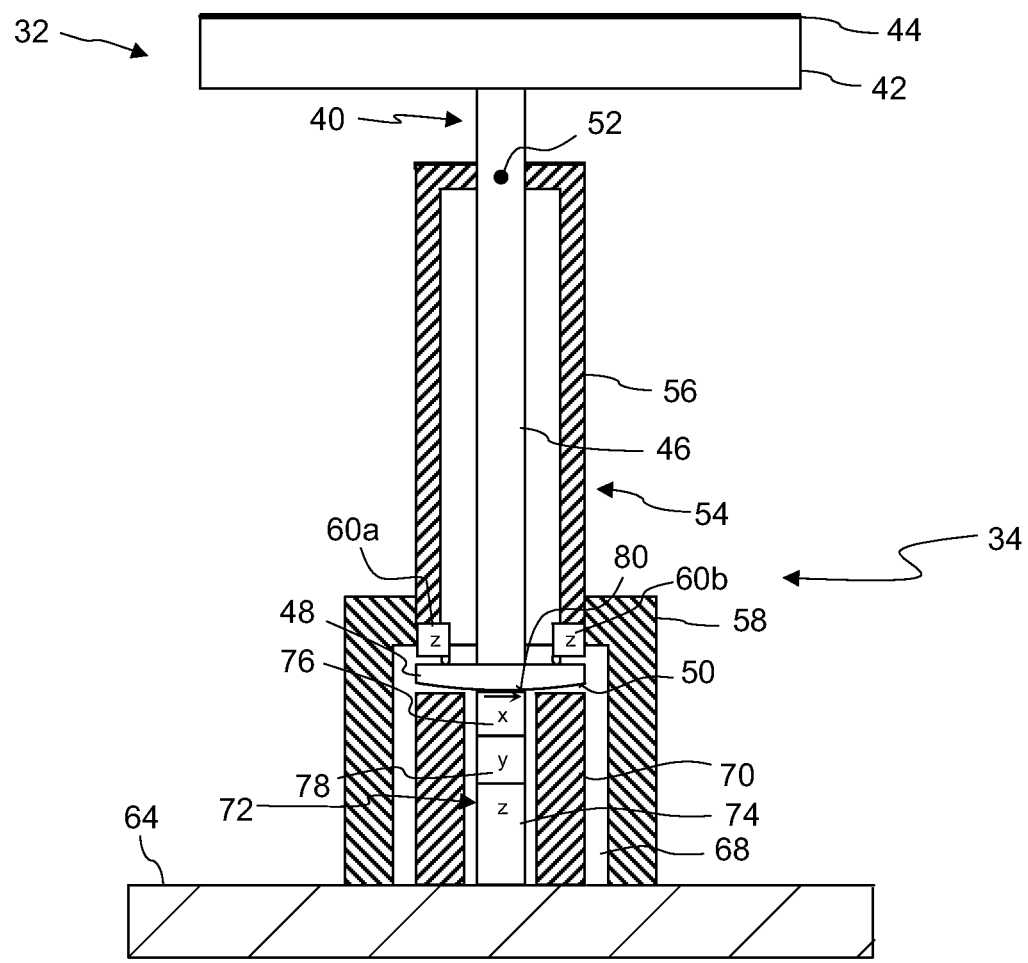
FIG. 19 shows the mirror facet unit shown in FIG. 18 in a different operating state.

FIG. 19 shows the mirror facet unit 34 of this embodiment when the lifting member 74 is in its second operating state. The contact surface 80 of the actuator 72 then contacts the actuating surface 50 of the mirror member 32. In order to maintain a sufficient friction between the actuating surface 50 and the contact surface 80 also in this operating state, the piezoelectric stacks 60a, 60b continue to exert a pressure force on the top side of the plate 48. Thus the piezoelectric stacks 60a, 60b are always in contact with the plate 48. Since the pressure has also to be exerted during tilting movements of the mirror member 32, the friction between the upper side of the plate 48 and the piezoelectric stacks 60a, 60b could be minimized.

In this embodiment the piezoelectric stacks 60a, 60b forming the preload device have to be actively controlled so that a desired frictional force is exerted between the plate 48 on the one hand and the actuator 72 or the rest member 70 on the other hand.

Figure 20:
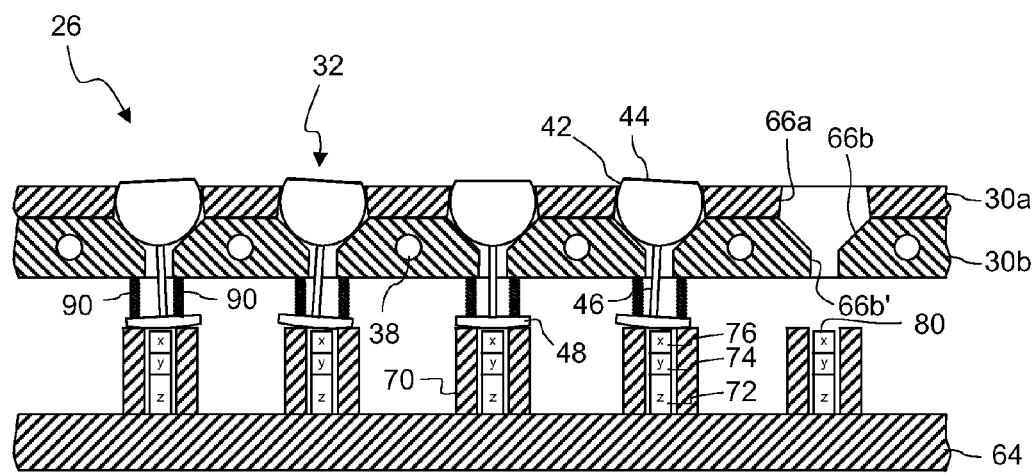
FIG. 20 is a cross-section through a portion of a multi facet mirror according to a still further embodiment in which the substrate of the mirror bodies has the shape of a truncated ball.

FIG. 20 is a cross-section through a portion of a multi facet mirror 26 according to a still further embodiment. Each mirror member 32 has a truncated ball-shaped body substrate 42 having a flat or curved area on which the reflective coating 44 is applied. The rod 46 has a longitudinal axis which coincides with an axis of symmetry of the ball-shaped substrate 42.

The cover plate consists of an upper plate 30a and a lower 30b that are attached to each other after the mirror members 32 have been inserted. As can be seen best at the right hand side of FIG. 20 where one mirror member 32 is not shown, the bores 66a in the upper plate 30a have the shape of truncated cones 67. In the lower plate 30b the bores have an upper conical portion 66b with an opposite cone angle and a cylindrical lower portion 66b'. The bores 66a of the upper plate 30a form, together with the conical portions 66b of the lower plate 30b, sockets for the ball-shaped substrates 42 of the mirror members 32. These sockets define the position of the tilting axes.

The rods 46 extend through the bores 66b of the lower plate 30b and project from a bottom surface of the lower plate 30b. The preload device 60 if formed in this embodiment by resilient members 90 that extend between the lower plate 30b and the plates 48 of the mirror bodies 40.

What is claimed is:

1. A multi facet mirror, comprising:
   a plurality of mirror facet units, each mirror facet unit comprising:
      a mirror member, comprising:
         a mirror body having a first end and a second end opposite the first end;
         a reflective coating at the first end of the mirror body; and
         an actuating surface at the second end of the mirror body;
      a bearing defining a tilting axis;
      a rest member, the actuating surface resting one the rest member when the mirror member is not moving; and
      an actuator configured to tilt the mirror member about the tilting axis, the actuator comprising:
         a contact surface;
         a lifting member configured to move the actuating surface along a lifting direction; and
         a displacement member,
   wherein:
      in a first operating state of the lifting member, the actuating surface rests at least mainly on the rest member;
      in a second operating state of the lifting member, the actuating surface rests at least mainly on the contact surface; and
      the displacement member is configured to displace the contact surface along a lateral direction which forms an angle distinct from 0° relative to the lifting direction only when the lifting member is in its second operating state.

2. The multi facet mirror of claim 1, wherein the lifting member and the displacement member are configured to perform oscillating movements which are synchronized to each other.

3. The multi facet mirror of claim 2, wherein the mirror body comprises:
   a substrate, the reflective coating being supported by the substrate;
   a plate, the actuating surface being supported by the plate; and
   a rod connecting the substrate to the plate.

4. The multi facet mirror of claim 1, wherein the mirror body comprises:
   a substrate, the reflective coating being supported by the substrate;
   a plate, the actuating surface being supported by the plate; and
   a rod connecting the substrate to the plate.

5. The multi facet mirror of claim 1, wherein the actuating surface is convexly curved.

6. The multi facet mirror of claim 5, wherein the actuating surface has, in a plane perpendicular to the tilting axis, a circular arc profile with a center of curvature located on the tilting axis.

7. The multi facet mirror of claim 1, wherein of the lifting member comprises piezoelectric stacks, and the displacement member comprises piezo-electric stacks.

8. The multi facet mirror of claim 7, wherein the lifting member and the displacement member are configured to perform oscillating movements which are synchronized to each other.

9. The multi facet mirror of claim 7, wherein the mirror body comprises:
   a substrate, the reflective coating being supported by the substrate;
   a plate, the actuating surface being supported by the plate; and
   a rod connecting the substrate to the plate.

10. The multi facet mirror of claim 7, wherein the piezoelectric stacks are arranged one on top of each other to provide a multi-axis piezoelectric component, and the contact surface is on the multi-axis piezoelectric component.

11. The multi facet mirror of claim 1, further comprising a preload device configured to exert a preload force to press the actuating surface against the rest member when the lifting member is in the first operating state.

12. The multi facet mirror of claim 11, wherein the preload device comprises a resilient member or a controllable pressure member.

13. The multi facet mirror of claim 11, wherein the mirror body comprises:

a substrate, the reflective coating being supported by the substrate;

a plate, the actuating surface being supported by the plate; and a rod connecting the substrate to the plate.

14. The multi facet mirror of claim 11, wherein the piezoelectric stacks are arranged one on top of each other to provide a multi-axis piezoelectric component, and the contact surface is on the multi-axis piezoelectric component.

15. The multi facet mirror of claim 1, wherein the rest member at least partially surrounds the displacement member.

16. The multi facet mirror of claim 1, wherein the lifting member is integrated into the rest member.

17. The multi facet mirror of claim 1, wherein the actuating surface is convexly curved, and the mirror body comprises:

a substrate, the reflective coating being supported by the substrate;

a plate, the actuating surface being supported by the plate; and a rod connecting the substrate to the plate.

18. An illumination system, comprising:

a multi facet mirror according to claim 1, wherein the illumination system is a microlithographic illumination system.

19. An apparatus, comprising:

an illumination system comprising a multi face mirror according to claim 1; and a projection objective, wherein the apparatus is a microlithographic projection exposure apparatus.

20. A method of operating a microlithographic projection exposure apparatus comprising an illumination system and a projection objective, the method comprising:

using the illumination system to illuminate a mask comprising a pattern; and using the projection objective to project the pattern onto a photoresist, wherein the illumination system comprises a multi facet mirror according to claim 1.

* * * * *

UNITED STATES PATENT AND TRADEMARK OFFICE
CERTIFICATE OF CORRECTION

PATENT NO. : 9,041,910 B2
APPLICATION NO. : 13/747142
DATED : May 26, 2015
INVENTOR(S) : Thorsten Rassel and Markus Hauf Page 1 of 1

It is certified that error appears in the above-identified patent and that said Letters Patent is hereby corrected as shown below:

In the Claims

Col. 11, line 64, Claim 1, delete "one" and insert -- on --.

Col. 14, line 6, Claim 19, delete "face" and insert -- facet --.

Signed and Sealed this
Twelfth Day of April, 2016

Michelle K. Lee
*Director of the United States Patent and Trademark Office*